(12) United States Patent
Nishikawa et al.

(10) Patent No.: US 8,280,235 B2
(45) Date of Patent: Oct. 2, 2012

(54) LIQUID MATERIAL VAPORIZER

(75) Inventors: Ichiro Nishikawa, Kyoto (JP); Takeshi Kawano, Uji (JP)

(73) Assignee: Horiba Stec, Co., Ltd., Kyoto-shi (JP)

( * ) Notice: Subject to any disclaimer, the term of this patent is extended or adjusted under 35 U.S.C. 154(b) by 919 days.

(21) Appl. No.: 12/295,862

(22) PCT Filed: Apr. 4, 2007

(86) PCT No.: PCT/JP2007/057593
§ 371 (c)(1),
(2), (4) Date: Nov. 13, 2008

(87) PCT Pub. No.: WO2007/114474
PCT Pub. Date: Oct. 11, 2007

(65) Prior Publication Data
US 2009/0097831 A1    Apr. 16, 2009

(30) Foreign Application Priority Data
Apr. 5, 2006 (JP) .................. 2006-103803

(51) Int. Cl.
*F24H 1/18* (2006.01)
(52) U.S. Cl. .................... 392/401; 392/387
(58) Field of Classification Search .......... None
See application file for complete search history.

(56) References Cited

U.S. PATENT DOCUMENTS

| | | | |
|---|---|---|---|
| 5,520,001 A * | 5/1996 | Miyamoto et al. | 62/50.2 |
| 5,630,878 A * | 5/1997 | Miyamoto et al. | 118/715 |
| 6,082,714 A * | 7/2000 | Dornfest et al. | 261/142 |
| 6,258,170 B1 * | 7/2001 | Somekh et al. | 118/715 |
| 6,424,800 B1 | 7/2002 | Kim | |
| 6,470,144 B1 * | 10/2002 | Tarutani et al. | 392/396 |
| 6,494,957 B1 * | 12/2002 | Suzuki | 118/726 |
| 7,055,808 B2 * | 6/2006 | Sivaramakrishnan et al. | 261/62 |
| 2003/0226505 A1 * | 12/2003 | Sivaramakrishnan et al. | 118/726 |

FOREIGN PATENT DOCUMENTS

| | | |
|---|---|---|
| JP | 2003/163168 | 6/2003 |
| JP | 2004/031441 | 1/2004 |

OTHER PUBLICATIONS

ISA European Patent Office, Search Report of EP 07 74 1029, Feb. 19, 2010, Netherlands, 1 page.
Japanese Patent Office, International Search Report of PCT/JP2007/057593, Jun. 12, 2007, 2 pages, JPO.

* cited by examiner

*Primary Examiner* — Thor Campbell
(74) *Attorney, Agent, or Firm* — Alleman Hall McCoy Russell & Tuttle LLP

(57) ABSTRACT

A liquid material vaporizer comprises a gas-liquid mixing section for mixing a liquid material and a carrier gas to generate a gas-liquid mixture; a heating type vaporizing section for vaporizing the gas-liquid mixture from the gas-liquid mixing section and exhausting outside with an assistance of the carrier gas a gas generated by the vaporization; a connecting section for making a connection between the gas-liquid mixing section and the vaporizing section, the connecting section having inside a flow path for the gas-liquid mixture; and a connecting section cooling section for cooling the connecting section. Thus, the liquid material vaporizer which performs suitable vaporization by preventing residue from being generated even in the case of vaporizing a liquid material composed of a plurality of materials having different boiling points.

9 Claims, 7 Drawing Sheets

LIQUID MATERIAL VAPORIZER

FIELD OF THE INVENTION

The present invention relates to a liquid material vaporizer for vaporizing various liquid materials used in semiconductor manufacturing.

BACKGROUND ART

There is conventionally known a liquid material vaporizer adapted to be able to surely vaporize a liquid material without thermal decomposition even if the liquid material is likely to be thermally decomposed.

Specifically, this sort of liquid material vaporizer includes: a gas-liquid mixing section including a control valve that is supplied with a liquid material and a carrier gas, and provided with a flow rate control function for mixing the liquid material with the carrier gas while controlling a flow rate of the liquid material; a vaporizing section that is provided separately from the gas-liquid mixing section, and intended for discharging and depressurizing a gas-liquid mixture introduced from the gas-liquid mixing section through a pipeline to thereby vaporize the liquid material and exhausting with the assistance of the carrier gas a gas generated by the vaporization; the pipeline for making a connection between the gas-liquid mixing section and the vaporizing section; and the like (see, for example, Patent document 1).

Patent document 1: Japanese Unexamined Patent Publication No. 2003-163168

DISCLOSURE OF THE INVENTION

Problems to be Solved by the Invention

However, a conventional configuration has a problem that if the liquid material formed by dissolving a high boiling point solute in a low boiling point material solvent is vaporized, only the low boiling point material solvent is vaporized in the pipeline, and the high boiling point solute becomes a residue, which blocks the pipeline, and other problems.

The present invention is made by focusing on such problems, and a main object thereof is to provide an excellent liquid material vaporizer that, even if the liquid material formed by dissolving the high boiling point solute in the low boiling point material solvent is vaporized, does not have the problem that only the low boiling point material solvent is vaporized in the pipeline, and the high boiling point solute becomes a residue, which blocks the pipeline.

Means Adapted to Solve the Problems

That is, a liquid material vaporizer according to the present invention is configured to include: a gas-liquid mixing section for mixing a liquid material and a carrier gas to generate a gas-liquid mixture; a heating type vaporizing section for vaporizing the gas-liquid mixture from the gas-liquid mixing section and exhausting outside with an assistance of the carrier gas a gas generated by the vaporization; a connecting section for making a connection between the gas-liquid mixing section and the vaporizing section, the connecting section having a flow path for the gas-liquid mixture inside thereof; and a connecting section cooling section for cooling the connecting section.

Note that the "liquid material" by which an effect of the liquid material vaporizer of the present invention can be particularly verified includes a liquid-like material in which a plurality of materials having different boiling points are mixed, for example, a liquid material formed by dissolving a high boiling point solute in a low boiling point material solvent. In addition, it should be appreciated that the liquid material vaporizer can vaporize the other liquid materials (for example, one including a single constituent, one in which a plurality of materials having a same boiling point are mixed, and the like). Also, a method for producing the liquid material may be any one, for example, one including dissolving a solid in a liquid to form the liquid material, one including mixing liquids with each other, or other method.

Such configuration enables heat of the vaporizing section to be suppressed from transferring toward the gas-liquid mixing section, and the gas-liquid mixture passing through a flow path inside the connecting section to be suppressed from being affected by energy of the heat, by the connecting section cooling section cooling the connecting section. Accordingly, even if the liquid material formed by, for example, dissolving a high boiling point solute in a low boiling point material solvent is vaporized, there can be prevented a problem that only the low boiling point material solvent is vaporized, and the high boiling point solute becomes a residue in a pipeline, or diaphragm for liquid flow rate control inside the gas-liquid mixing section, which blocks an internal flow path of the connecting section or the diaphragm.

That is, there can be provided an excellent liquid material vaporizer capable of, even if the liquid material including a plurality of materials having different boiling points is vaporized, preventing a residue from being generated, and preferably performing the vaporization.

To obtain a higher effect of preventing the residue generation, the connecting section cooling section preferably cools the connecting section substantially entirely.

Even if the vaporizing section is heated to and retained at approximately 300 degrees C., the gas-liquid mixing section can be cooled to approximately 60 degrees C. by an action of the connecting section cooling section, and therefore the residue can be preferably prevented from being generated while ensuring a function of a high temperature type vaporizing section.

A specific aspect of the connecting section cooling section of the present invention includes one in which the connecting section cooling section is configured to include one or a plurality of connecting section cooling fins that are supplied with a cooling gas and fitted to the connecting section. By employing such a configuration, a high cooling effect can be obtained, and the problem of the residue generation can be preferably prevented even though the configuration is simple.

With this, if the connecting section cooling fins are arranged in a cooling case having: an inlet for introducing the cooling gas inside thereof; and an outlet for exhausting the cooling gas having been used for cooling outside thereof, the cooling gas can be effectively supplied to the connecting section cooling fins, so that in addition to effectively cooling the connecting section cooling fins, required cold air from the cooling gas can be prevented from escaping and wasting, which is useful for energy saving.

Providing a cooling gas cooling section for preliminarily cooling the cooling gas enables a higher cooling effect in the connecting section to be obtained, and is effective in preventing the above-described problem.

Note that a desirable aspect of the cooling gas cooling section includes one in which the cooling gas cooling section includes: one or a plurality of cooling gas cooling fins; and a cooling gas cooling Peltier element configured to be fitted toward a flow path for the cooling gas on a cooling side thereof and fitted to the cooling gas cooling fins on a heat generating side thereof.

Another specific aspect of the connecting section cooling section of the present invention includes one in which the connecting section cooling section is configured to include: a connecting section cooling Peltier element fitted to the connecting section on a cooling side thereof; and one or a plurality of Peltier element cooling fins fitted to a heat generating side of the connecting section cooling Peltier element.

Effect of the Invention

As described, the liquid material vaporizer according to the present invention enables the heat of the vaporizing section to be suppressed from transferring toward the gas-liquid mixing section, and the gas-liquid mixture passing through a flow path inside the connecting section to be suppressed from being affected by energy of the heat, by the connecting section cooling section cooling the connecting section. Accordingly, even if the liquid material formed by, for example, dissolving a high boiling point solute in a low boiling point material solvent is vaporized, there can be prevented a problem that only the low boiling point material solvent is vaporized, and the high boiling point solute becomes a residue in a pipeline, or diaphragm for liquid flow rate control inside the gas-liquid mixing section, which blocks an internal flow path of the connecting section, or the diaphragm.

That is, there can be provided an excellent liquid material vaporizer capable of, even if the liquid material including a plurality of materials having different boiling points is vaporized, preventing the residue from being generated, and preferably performing the vaporization.

BEST MODE FOR CARRYING OUT THE INVENTION

Figure 1:
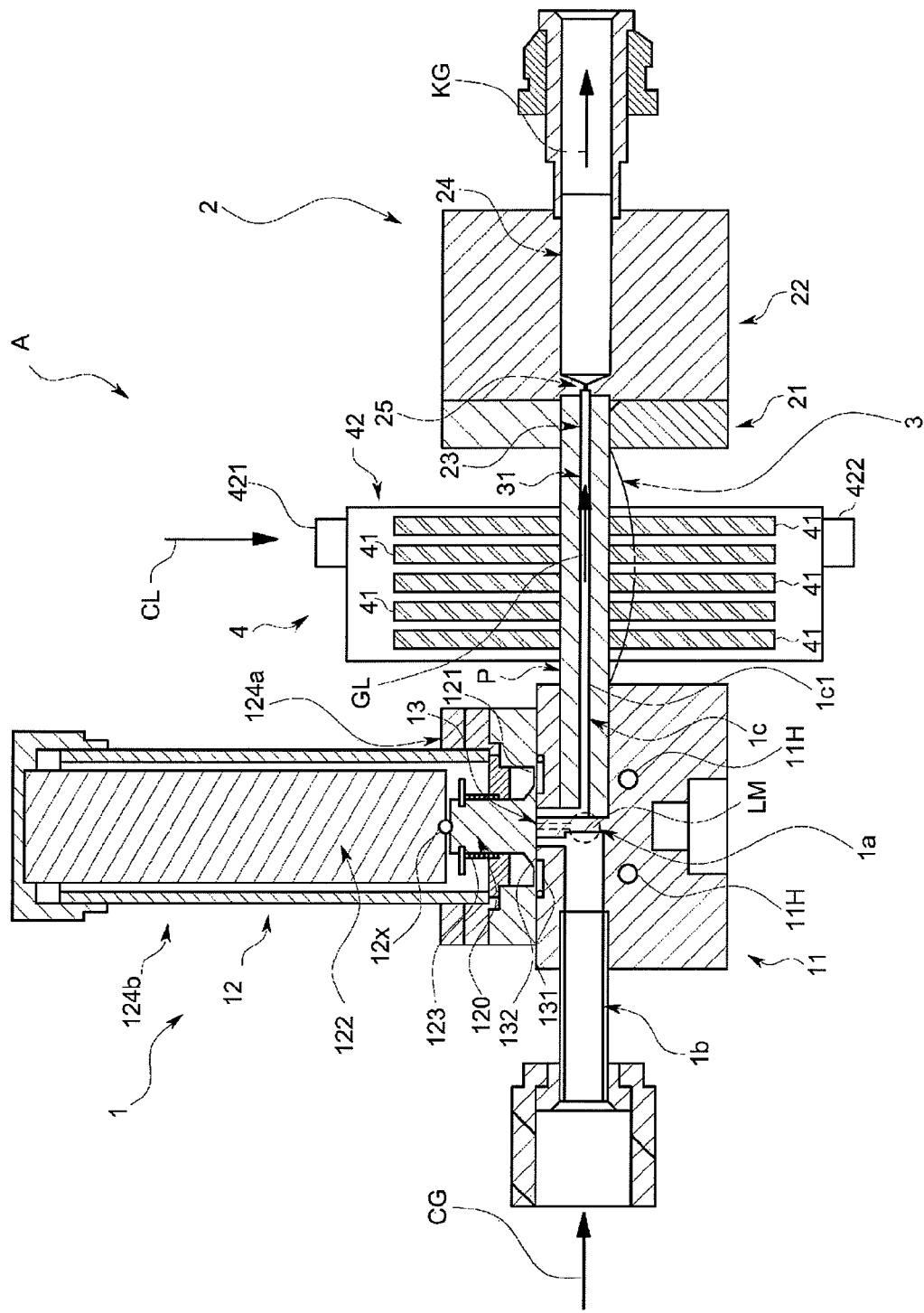
FIG. 1 is a structural cross-sectional view schematically illustrating a structural cross-section of a liquid material vaporizer according to one embodiment of the present invention.

One embodiment of the present invention is described below referring to the drawings.

Figure 2:
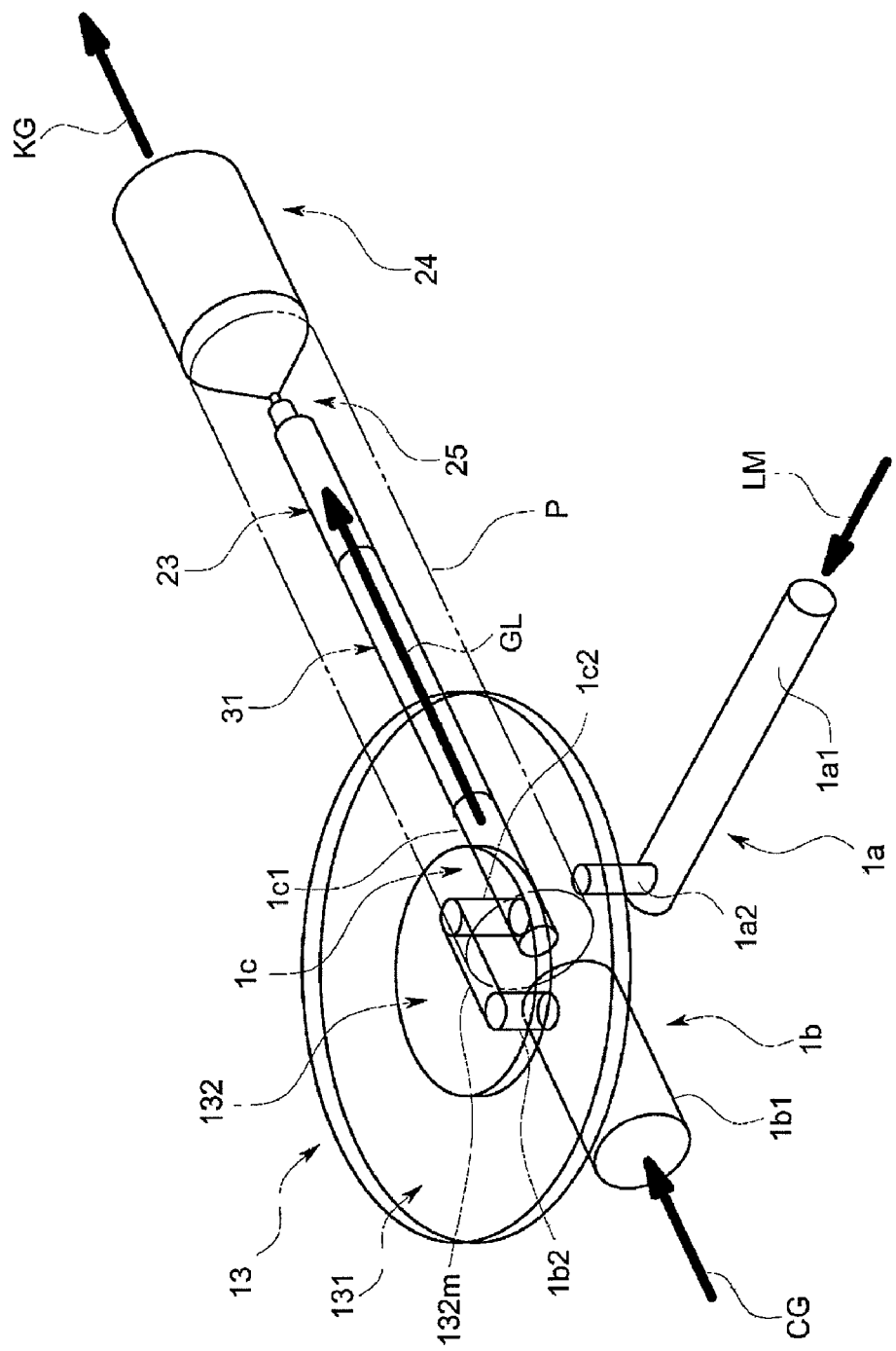
FIG. 2 is a perspective view of a main part in a same embodiment.

A liquid material vaporizer A of the present embodiment is, as illustrated in FIGS. 1 and 2, configured to include: a gas-liquid mixing section 1 for mixing a liquid material LM and a carrier gas CG to generate a gas-liquid mixture GL; a heating type vaporizing section 2 for vaporizing the gas-liquid mixture GL from the gas-liquid mixing section 1 and exhausting the vaporized gas outside with an assistance of the carrier gas CG; a connecting section 3 that is intended for making a connection between the gas-liquid mixing section 1 and the vaporizing section 2 and has inside a flow path for the gas-liquid mixture GL or the like; and a connecting section cooling section 4 for cooling the connecting section 3. The respective sections are specifically described below.

The gas-liquid mixing section 1 is configured to include: a substantially rectangular-shaped main body block 11 having three different flow paths 1a to 1c inside; a flow rate controlling section 12 provided on an upper surface side of the main body block 11; a gas-liquid mixing chamber 13 formed in a space sandwiched between the main body block 11 and the flow rate controlling section 12.

The main body block 11 is formed of a metal material having high thermal and corrosion resistance, such as stainless steel, and configured to be heatable with a heater 11H provided on a lower end side of the three flow paths 1a to 1c.

The three flow paths 1a to 1c respectively refer to: a liquid material introduction path 1a for introducing the liquid material LM into the gas-liquid mixing chamber 13; a carrier gas introduction path 1b for introducing the carrier gas CG into the gas-liquid mixing chamber 13; and a gas-liquid mixture exhaust path 1c for exhausting the gas-liquid mixture GL generated in the gas-liquid mixing chamber 13.

The liquid material introduction path 1a is, as illustrated in FIG. 2 and other drawings, one having a substantially L shape, as viewed from side, including: a liquid material introduction path horizontal section 1a1 extending in a horizontal direction; and a liquid material introduction path rising section 1a2 in which a gas-liquid mixing chamber 13 side of the liquid material introduction path horizontal section 1a1 is risen in a substantially vertical direction. In the present embodiment, a diameter of the liquid material introduction path horizontal section 1a1 is made substantially equal to that of the liquid material introduction path rising section 1a2.

The carrier gas introduction path 1b is, as illustrated in FIG. 2 and other drawings, one having a substantially L shape, as viewed from side, including: a carrier gas introduction path horizontal section 1b1 extending in a horizontal direction; and a carrier gas introduction path rising section 1b2 in which a gas-liquid mixing chamber 13 side of the carrier gas introduction path horizontal section 1b1 is risen in a substantially vertical direction. In the present embodiment, a diameter of the carrier gas introduction path horizontal section 1b1 is made larger than that of the carrier gas introduction path rising section 1b2.

The gas-liquid mixture exhaust path 1c is, as illustrated in FIG. 2 and other drawings, one having a substantially L shape, as viewed from side, including: a gas-liquid mixture exhaust path horizontal section 1c1 extending in a horizontal direction; and a gas-liquid mixture exhaust path rising section 1c2 in which a gas-liquid mixing chamber 13 side of the gas-liquid mixture exhaust path horizontal section 1c1 is risen in a substantially vertical direction. In the present embodiment, a diameter of the gas-liquid mixture exhaust path horizontal section 1c1 is made equal to that of the gas-liquid mixture exhaust path rising section 1c2.

Figure 3:
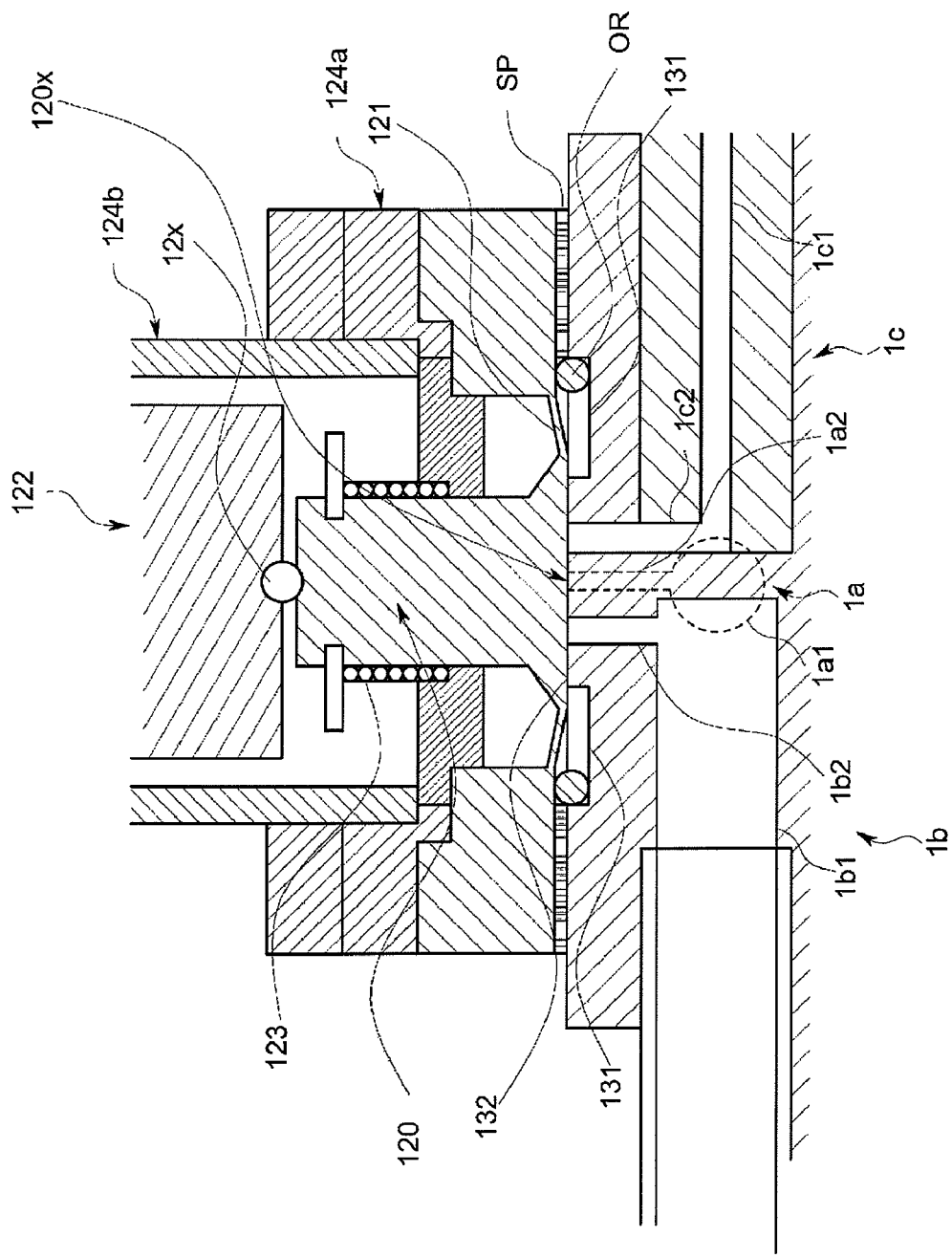
FIG. 3 is a structural cross-sectional view of a gas-liquid mixing chamber portion in the same embodiment (with a volume of the gas-liquid mixing chamber being reduced).
Figure 4:
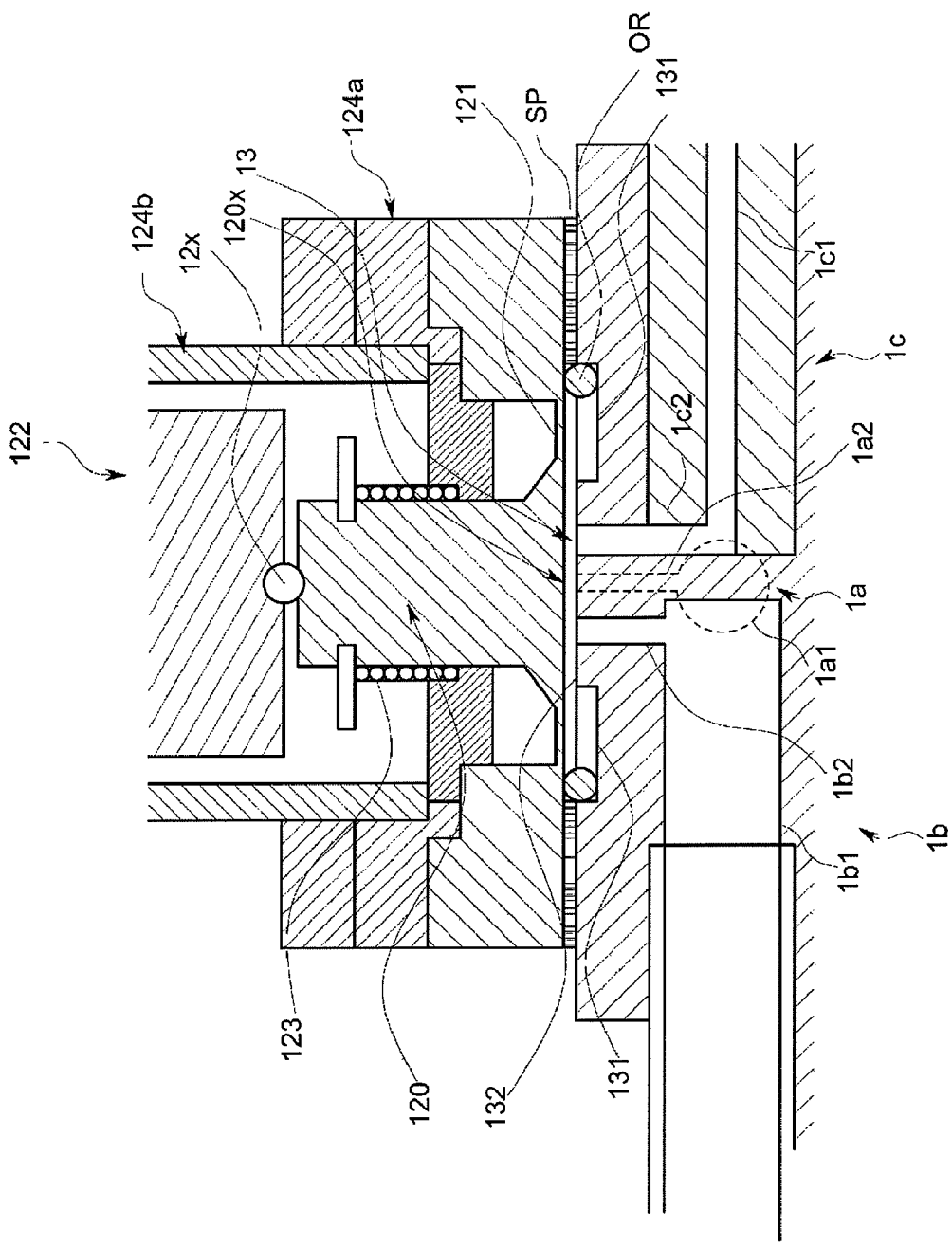
FIG. 4 is a structural cross-sectional view of the gas-liquid mixing chamber portion in the same embodiment (with the volume of the gas-liquid mixing chamber being normal).

The flow rate controlling section 12 is, as illustrated in FIGS. 3 and 4 and other drawings, configured to include: a thin disk-like diaphragm 121 arranged in a position where a concave portion 131 of the main body block 11 can be covered; a substantially cylindrical shaft section 120 provided in the center of the diaphragm 121; a piezo actuator 122 brought into abutting contact with an upper end part of the shaft section 120 via a sphere 12x; and a biasing member 123 for constantly biasing the shaft section 120 upward, and these respective components are contained inside a valve block 124a and also inside a substantially tubular housing 124b provided upright on an upper part of the valve block 124a. Note that, in the present embodiment, the valve block 124a is fitted onto the main body block 11 via a spacer SP and an O-ring OR.

Also, in the present embodiment, when the diaphragm 121 is subjected to a pressing force (pressing force larger than a biasing force by the biasing member 123) downward by the piezo actuator 122 via the shaft section 120, it is displaced convexly downward to decrease a volume inside the gas-liquid mixing chamber 13 formed between the diaphragm 121 and a valve seat 132, and block an opening of the liquid material introduction path rising section 1a2 by a lower end surface 120x of the shaft section 120 (see FIG. 3), whereas when it is not subjected to the pressing force, the diaphragm 121 and the lower end surface 120x of the shaft section 120 are kept at a level spaced from the valve seat 132 (by an amount equal to a thickness of the spacer SP), and the volume inside the gas-liquid mixing chamber 13 can be appropriately ensured (see FIG. 4).

The gas-liquid mixing chamber 13 is one formed in a space sandwiched between the concave portion 131 in which an upper surface of the main body block 11 is concaved in a substantially dish-like shape and the valve seat 132 of a circular shape as viewed planarly that is arranged in the center of the concave portion 131 and provided at a level higher than a bottom level of the concave portion 131, and an after-mentioned lower end surface of the diaphragm 121 of the flow rate controlling section 12 (see FIG. 4).

In addition, on the concave portion 131, the liquid material introduction path rising section 1a2 is opened.

Also, the valve seat 132 is provided with a mixing groove 132m of a substantially oval shape as viewed planarly. Further, in the mixing groove 132m, the carrier gas introduction path rising section 1b2 is opened, and the gas-liquid mixture exhaust path rising section 1c2 is opened.

The vaporizing section 2 is configured to include: a preheating block 21; a vaporizing block 22 provided on a side of the preheating block 21 opposite to the gas-liquid mixing section 1; a gas introduction path 23 that is provided in substantially the center of the preheating block 21 and passes through in a thickness direction of the preheating block 22; a gas exhaust path 24 that is provided in substantially the center of the vaporizing block 22 and passes through in a thickness direction of the vaporizing block 22; and a nozzle section 25 provided at a connecting section between the gas introduction path 23 and the gas exhaust path 24.

The preheating block 21 is one formed of a metal material having high thermal conductivity, such as aluminum.

The vaporizing block 22 is one formed of a metal material having high thermal and corrosion resistance, such as stainless steel. Also, the vaporizing block 22 incorporates a heater (not shown). By the heater, a whole of the vaporizing block 22 including the nozzle section 25 is adapted to be heated to and retained at a temperature (e.g., approximately 300 degrees C.) considerably higher than a heating and retaining temperature of the main body block 11.

The gas introduction path 23 is one formed by using an after-mentioned internal flow path of a pipe member P.

The gas exhaust path 24 is a substantially straight pipe, whose end on the nozzle section 25 side is formed in a conic shape. In the present embodiment, an outer diameter of the gas exhaust path 24 is set larger than that of the gas introduction path 23. Also, a downstream side of the gas exhaust path 24 is connected to a pipeline (not shown) to semiconductor manufacturing equipment.

The nozzle section 25 is considerably small as compared with diameters and lengths of the gas introduction path 23 and the gas exhaust path 24, and has a diameter and length of, for example, 1.0 mm or less and approximately 1.0 mm, respectively. Through the nozzle section 25, the gas-liquid mixture GL introduced through the gas introduction path 23 flows, and upon the flow, the liquid material LM contained in the gas-liquid mixture GL is depressurized and thereby vaporized, and a gas generated by the vaporization is mixed with the carrier gas CG to become a gas mixture KG.

The connecting section 3 is one having an internal flow path 31 for introducing inside the gas-liquid mixture GL and carrier gas CG from the gas-liquid mixture exhaust path 1c and exhausting them toward the gas exhaust path 23 of the vaporizing section 2. In the present embodiment, the internal flow path 31 of the connecting section 3, the gas-liquid mixture exhaust path horizontal section 1c1 of the gas-liquid mixing section 1, and the gas introduction path 23 of the vaporizing section 2 are adapted to be formed by using the internal flow path of the common pipe member P.

The connecting section cooling section 4 is one of a "forced air cooling type" provided with a plurality of connecting section cooling fins 41 that are externally supplied with a cooling gas CL and fitted to the connecting section 3. Also, the connecting section cooling fins 41 respectively use the same thin plate like fins. Also, the connecting section cooling fins 41 are arrayed at given intervals so as not to prevent the flow of the cooling gas CL. Further, the plurality of connecting section cooling fins 41 are arranged in a cooling case 42 having an inlet 421 for introducing inside the cooling gas CL and an outlet 422 for exhausting outside the cooling gas having been used for cooling.

Next, the usage of the liquid material vaporizer A having the above configuration is described.

First, the liquid material LM through the liquid material introduction path 1a is introduced into the mixing groove 132 with a flow rate thereof into the mixing groove 132m being controlled by the lower end surface 120x of the shaft section 120 driven by the piezo actuator 122, and also the carrier gas CG is introduced into the mixing groove 132m through the carrier gas introduction path 1b. The liquid material LM and carrier gas CG are mixed with each other in the mixing groove 132m, and then exhausted into the gas-liquid mixture exhaust path 1c as the gas-liquid mixture GL. The gas-liquid mixture GL further reaches the vaporizing section 2 through the internal flow path 31 of the connecting section 3.

Note that the connecting section 3 is cooled by the connecting section cooling section 4. This enables heat of the vaporizing section 2 to be suppressed from transferring toward the gas-liquid mixing section 1, and the gas-liquid mixture GL passing through the internal flow path 31 and the like of the connecting section 3 to be suppressed from being affected by energy of the heat. Specifically, if a temperature due to the heat of the vaporizing section 2 is approximately 300 degrees C. and the connecting section cooling section 4 is absent, a temperature of the gas-liquid mixing section 1 is approximately 100 degrees C., whereas if the connecting section cooling section 4 is present, the temperature of the gas-liquid mixing section 1 can be reduced to approximately 60 degrees C. Accordingly, even if the liquid material LM formed by, for example dissolving a high boiling point solute in a low boiling point material solvent is vaporized, there does not arise a problem that only the low boiling point material solvent is vaporized, and the high boiling point solute becomes a residue in the gas-liquid mixture exhaust path horizontal section 1c1 of the gas-liquid mixing section 1, the internal flow path 31 of the connecting section 3, the gas introduction path 23 of the vaporizing section 2, or the diaphragm 121 for liquid flow rate control inside the gas-liquid mixing section 1, which blocks the internal flow path of the connecting section 3 or the diaphragm 121.

When the gas-liquid mixture GL having been introduced into the gas introduction path 23 of the vaporizing section 2 in a manner described above is further introduced into the nozzle section 25, the liquid material LM contained in the gas-liquid mixture GL is depressurized and thereby vaporized in the nozzle section 25. Then, the gas generated by the vaporization is mixed with the carrier gas CG to become the gas mixture KG, which is then exhausted outside.

Therefore, according to the liquid material vaporizer A as described above, the connecting section cooling section 4 cools the connecting section 3, whereby the heat of the vaporizing section 2 can be suppressed from transferring toward the gas-liquid mixing section 1, and the gas-liquid mixture GL passing through the flow path inside the connecting section 3 can be suppressed from being affected by the energy of the heat. Accordingly, even if the liquid material LM formed by, for example, dissolving a high boiling point solute in a low boiling point material solvent is vaporized, there can be prevented a problem that only the low boiling point material solvent is vaporized, and the high boiling point solute becomes a residue in the gas-liquid mixture exhaust path horizontal section 1c1 of the gas-liquid mixing section 1, the internal flow path 31 of the connecting section 3, the gas introduction path 23 of the vaporizing section 2, or the diaphragm 121 for liquid flow rate control inside the gas-liquid mixing section 1, which blocks each of the flow paths or the diaphragm 121.

That is, there can be provided the excellent liquid material vaporizer A capable of, even if the liquid material LM including a plurality of materials having different boiling points is vaporized, preventing the residue from being generated, and preferably performing the vaporization.

The connecting section cooling section 4 substantially entirely cools the connecting section 3, and, in addition to this, the connecting section cooling section 4 is configured to include the plurality of connecting section cooling fins 41 that are supplied with the cooling gas CL and fitted to the connecting section 3, so that, even if the vaporizing section 2 is heated to and retained at approximately 300 degrees C., the gas-liquid mixing section 1 can be cooled to approximately 60 degrees C. by an action of the connecting section cooling section 4. Accordingly, even with such a simple structure, a high cooling effect can be obtained in the connecting section cooling section 4, and the problem of generation of the residue can be preferably prevented, while ensuring a function of the high temperature type vaporizing section 2.

Note that the present invention is not limited to the above-described embodiment.

Figure 5:
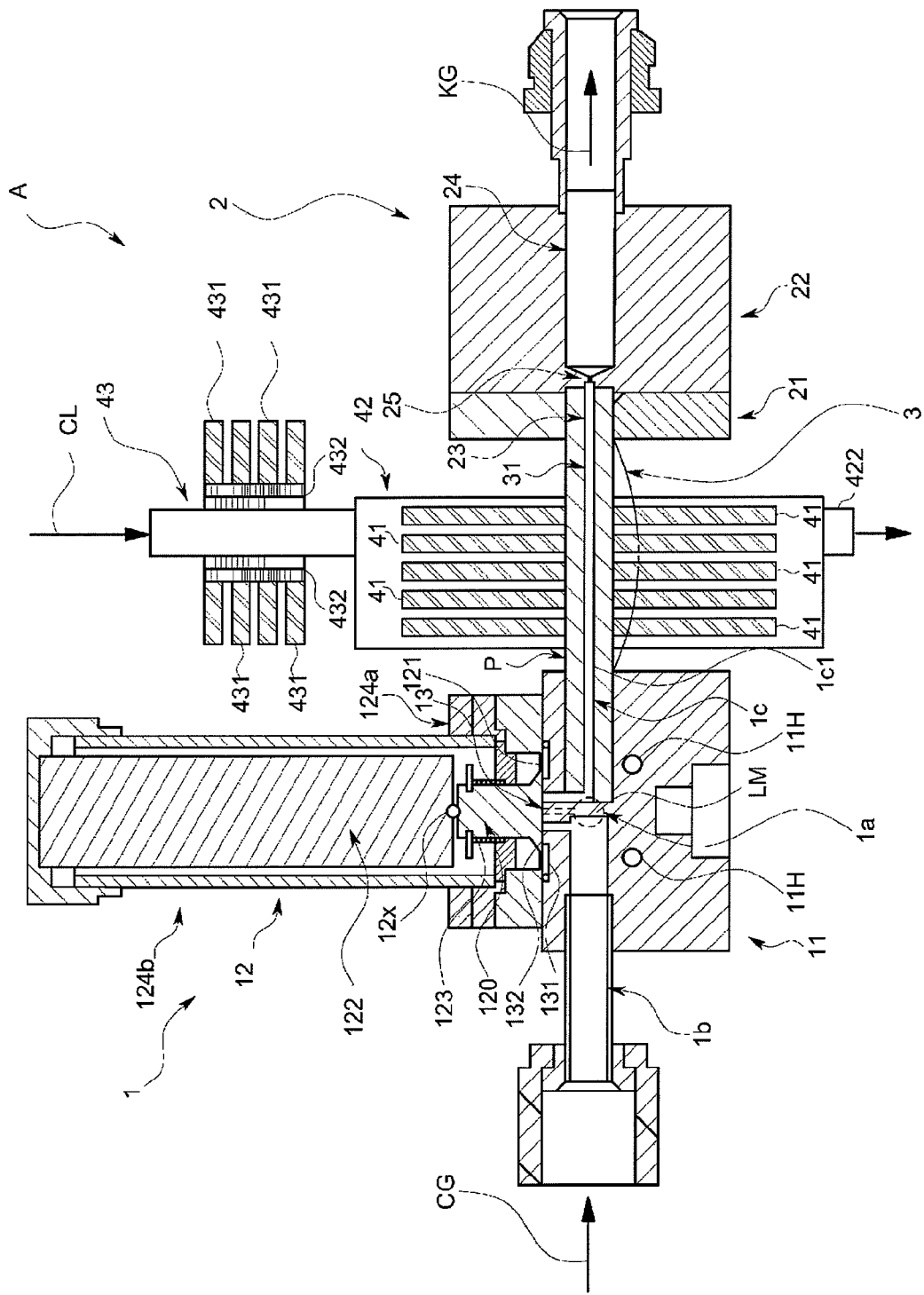
FIG. 5 is a structural cross-sectional view schematically illustrating a structural cross-section of a liquid material vaporizer according to another embodiment of the present invention.

For example, there may be employed an aspect including a cooling gas cooling section 43 for preliminarily cooling the cooling gas CL used for cooling the connecting section cooling fins 41. Specifically, as illustrated in FIG. 5, an aspect includes one adapted such that the cooling gas cooling section 43 includes: a plurality of cooling gas cooling fins 431; and a cooling gas cooling Peltier element 432 configured to be fitted toward a flow path for the cooling gas CL on a cooling side thereof and fitted to the cooling gas cooling fins 431 on a heat generating side thereof.

Employing such a configuration enables a higher cooling effect in the connecting section 3 to be obtained, and is further effective in preventing the above-described problem.

Figure 6:
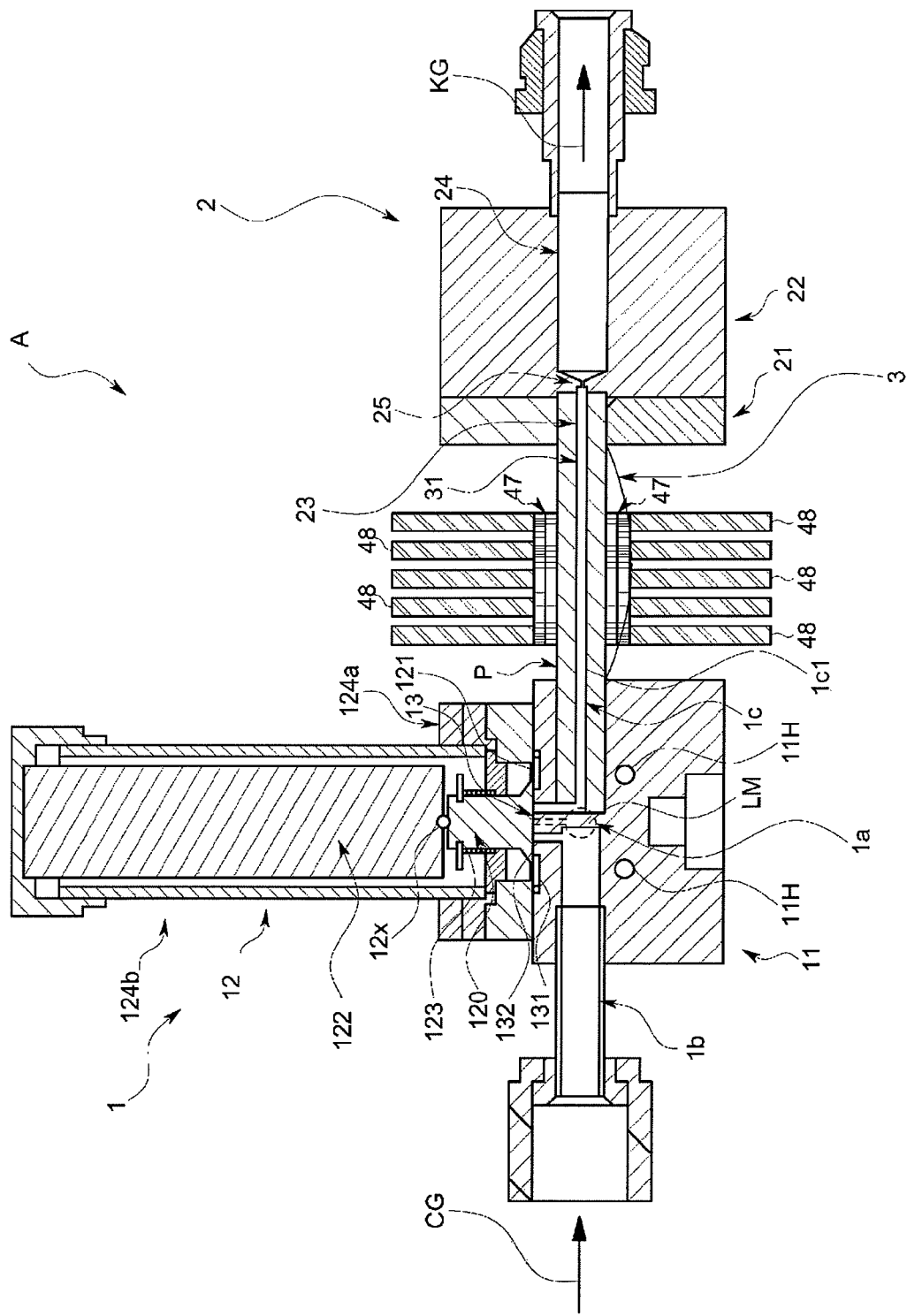
FIG. 6 is a structural cross-sectional view schematically illustrating a structural cross-section of a liquid material vaporizer according to further another embodiment of the present invention.

Also, as illustrated in FIG. 6, there may be employed an aspect in which the connecting section cooling section 4 is configured to include: a connecting section cooling Peltier element 47 fitted to the connecting section 3 on a cooling side thereof; and a plurality of Peltier element cooling fins 48 fitted to a heating side of the connecting section cooling Peltier element 47.

Employing such a configuration enables a problem of generation of the residue to be preferably prevented by directly, aggressively, and actively cooling the connecting section 3.

Figure 7:
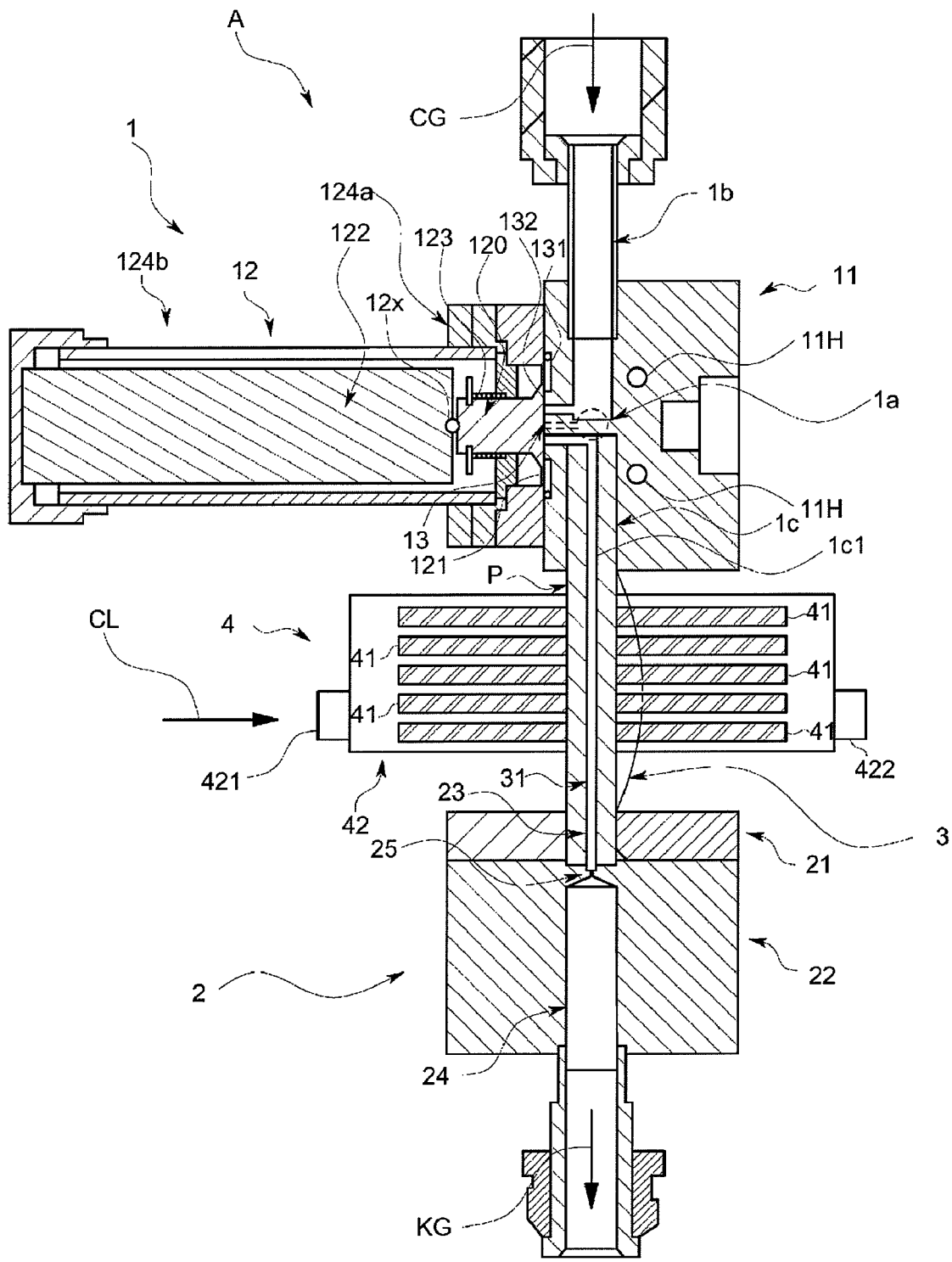
FIG. 7 is a structural cross-sectional view schematically illustrating a structural cross-section of a liquid material vaporizer according to still further another embodiment of the present invention.

Further, as illustrated in FIG. 7, there may be employed an embodiment in which the liquid material vaporizer A is configured to vertically arrange the gas-liquid mixing section 1, the connecting section 3 fitted with the connecting section cooling section 4, and the vaporizing section 2 in this order from the top.

Employing such a configuration enables a problem of blocking the nozzle section 25 to be prevented even if the liquid material LM remains in the nozzle section 25 of the vaporizing section 2, because the liquid material LM drops down due to gravitational force.

Further, a cooling method in the connecting section cooling section is not limited to that in the present embodiment, but an appropriate cooling method may be employed depending on an embodiment, such as water cooling using liquid for cooling.

Also, there may be employed a configuration in which a "backflow prevention nozzle" for preventing the liquid material supplied to the gas-liquid mixing chamber from flowing back into the carrier gas introduction path is further provided in addition to each of the above-described embodiments. A specific aspect of the backflow prevention nozzle includes, for example, a nozzle section for backflow prevention described in Japanese Unexamined Patent Publication No. 2003-273025 (pages 3 and 4, and FIG. 2).

Meanwhile, for example, if the gas introduction path 24 is hollow, lower pressure inside the path causes a gas density of the gas mixture KG to be reduced, resulting in a longer intermolecular distance. For this reason, heat becomes difficult to transfer, and therefore the gas mixture KG cannot be preferably exhausted outside. That is, the vaporization may be affected. For this reason, by arranging an unshown filling material in the gas introduction path 24, the heat transfer can be facilitated to preferably perform the vaporization even if the pressure inside the path is low. As the filling material, a metal material such as titanium having high thermal conductivity can be used. Also, regarding the filling material, a plurality of granular (spherical) filling materials may be arranged in the path, or one or a plurality of filling materials formed in a spiral shape by twisting flat plates (so-called static mixer) may be arranged in the path. The filling materials of the spiral shape result in lower pressure loss when arranged in the path, as compared with the granular filling materials, and therefore the vaporization can be more preferably performed.

Also, in a rear stage of the nozzle section 25, an unshown filter may be provided. Providing the filter enables the residue to be trapped even if the residue is generated. Also, even if unvaporized liquid of the gas-liquid mixture GL remains, from which mist is generated, the mist can be eliminated.

Further, the gas-liquid mixing section 1, the vaporizing section 2, the connecting section 3, and the connecting section cooling section 4 may be configured to be respectively decomposable. This enables the respective sections to be easily maintained.

Besides, a specific configuration of each of the sections is not limited to those in the above-described embodiments, but may be variously changed without departing from the scope of the present invention.

INDUSTRIAL APPLICABILITY

The liquid material vaporizer having such configuration according to the present invention can prevent a residue from being generated to preferably perform the vaporization even if a liquid material including a plurality of materials having different boiling points is vaporized, and is therefore preferably used as, for example, a liquid material vaporizer for vaporizing various liquid materials used in semiconductor manufacturing.

We claim:

1. A liquid material vaporizer comprising:
    a gas-liquid mixing section including a gas-liquid mixing chamber formed within a main body block for mixing a liquid material and a carrier gas to generate a gas-liquid mixture;
    a heating type vaporizing section including a vaporizing block for vaporizing the gas-liquid mixture from the gas-liquid mixing section and exhausting outside with an assistance of the carrier gas a gas generated by the vaporization;
    a connecting section for making a connection between the gas-liquid mixing chamber of the gas-liquid mixing section and the vaporizing block of the vaporizing section, the connecting section coupled to the main body block of the gas-liquid mixing section at one end and to the vaporizing block of the vaporizing section at an opposite end, the connecting section having inside a flow path for the gas-liquid mixture; and
    a connecting section cooling section for cooling both the connecting section and the gas-liquid mixing section, the cooling of the gas-liquid mixing section being achieved by reduction of transfer of heat between the vaporizing block and the gas-liquid mixing chamber.

2. The liquid material vaporizer according to claim 1, wherein the gas-liquid mixing chamber of the gas-liquid mixing section is controlled to alternately increase and decrease an internal volume.

3. The liquid material vaporizer according to claim 1, wherein the vaporizing section is heated to and retained at approximately 300 degrees C.

4. The liquid material vaporizer according to claim 1, wherein the connecting section cooling section comprises one or a plurality of connecting section cooling fins that are supplied with a cooling gas and fitted to the connecting section.

5. The liquid material vaporizer according to claim 4, wherein the connecting section cooling fins are arranged in a cooling case having: an inlet for introducing inside the cooling gas; and an outlet for exhausting outside the cooling gas having been used for cooling.

6. The liquid material vaporizer according to claim 4, comprising a cooling gas cooling section for preliminarily cooling the cooling gas.

7. The liquid material vaporizer according to claim 6, wherein the cooling gas cooling section comprises: one or the plurality of cooling gas cooling fins; and a cooling gas cooling Peltier element fitted toward a flow path for the cooling gas on a cooling side thereof and fitted to the cooling gas cooling fins on a heat generating side thereof.

8. The liquid material vaporizer according to claim 1, wherein the connecting section cooling section comprises: a connecting section cooling Peltier element fitted to the connecting section on a cooling side thereof; and one or a plurality of Peltier element cooling fins fitted to a heat generating side of the connecting section cooling Peltier element.

9. The liquid material vaporizer according to claim 2, wherein the connecting section cooling section substantially entirely cools the connecting section.

\* \* \* \* \*